US007988335B2

(12) United States Patent
Liu et al.

(10) Patent No.: US 7,988,335 B2
(45) Date of Patent: Aug. 2, 2011

(54) LED ILLUMINATING DEVICE AND LAMP UNIT THEREOF

(75) Inventors: Tay-Jian Liu, Taipei Hsien (TW); Feng Tian, Shenzhen (CN); Ying Xiong, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 278 days.

(21) Appl. No.: 12/478,772

(22) Filed: Jun. 5, 2009

(65) Prior Publication Data

US 2010/0177514 A1    Jul. 15, 2010

(30) Foreign Application Priority Data

Jan. 10, 2009    (CN) .......................... 2009 1 0300135

(51) Int. Cl.
*F21V 29/00*    (2006.01)
(52) U.S. Cl. .................. 362/294; 362/373; 362/249.02; 362/240; 362/362; 362/218

(58) Field of Classification Search .................. 362/294, 362/373, 249.02, 362, 240, 800, 218
See application file for complete search history.

(56) References Cited

U.S. PATENT DOCUMENTS

| 7,854,534 B2 * | 12/2010 | Liu | 362/294 |
| 7,926,982 B2 * | 4/2011 | Liu | 362/294 |
| 2009/0262533 A1 * | 10/2009 | Liu et al. | 362/249.02 |
| 2009/0262543 A1 * | 10/2009 | Ho | 362/373 |

* cited by examiner

*Primary Examiner* — Evan Dzierzynski
(74) *Attorney, Agent, or Firm* — Frank R. Niranjan

(57) ABSTRACT

An LED illuminating device includes a mounting module and a lamp unit mounted in the mounting module. The lamp unit includes a light-emitting module and a heat sink. The light-emitting module includes a light source having a plurality of LEDs, and a light penetrable cover located below the light source and defining a plurality of air venting holes therein. The heat sink includes an elongated base defining a plurality of air exchanging holes therein and a plurality of fins. The base has an outer convex surface and an opposite inner concave surface defining an elongated recess. The light source is received in the recess and thermally attached to the concave surface. Air flows into and out of a chamber defined between the base and the cover via the venting holes of the cover and the air exchanging holes of the base.

20 Claims, 10 Drawing Sheets

LED ILLUMINATING DEVICE AND LAMP UNIT THEREOF

CROSS-REFERENCE TO RELATED APPLICATION

This application is related to a co-pending U.S. patent application entitled "LED ILLUMINATION DEVICE AND LAMP UNIT THEREOF" Ser. No. 12/478,773 and filed in the same day as the instant application. The co-pending U.S. patent application is assigned to the same assignee as the instant application. The disclosures of the above-identified applications are incorporated herein by reference.

BACKGROUND

1. Technical Field

The present disclosure relates to light emitting diode (LED) illuminating device, and particularly to an LED illuminating device and a lamp unit thereof with high heat dissipating efficiency and wide illumination area.

2. Description of Related Art

In recent years, LEDs are preferred for use in illuminating devices rather than CCFLs (cold cathode fluorescent lamps) due to their excellent properties, including high brightness, long lifespan, wide color range, and etc.

For an LED, about eighty percents of the power consumed thereby is converted into heat. Generally, the illuminating device includes a plurality of LEDs and the LEDs are arranged on a flat surface whereby an illumination area of the LEDs is limited. Thus, the illuminating device cannot obtain a desired illumination area. In addition, heat dissipation of the LED illuminating device is a problem inhibiting the application of the LED illuminating device, which requires to be resolved.

For the foregoing reasons, therefore, there is a need in the art for an LED illuminating device which overcomes the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
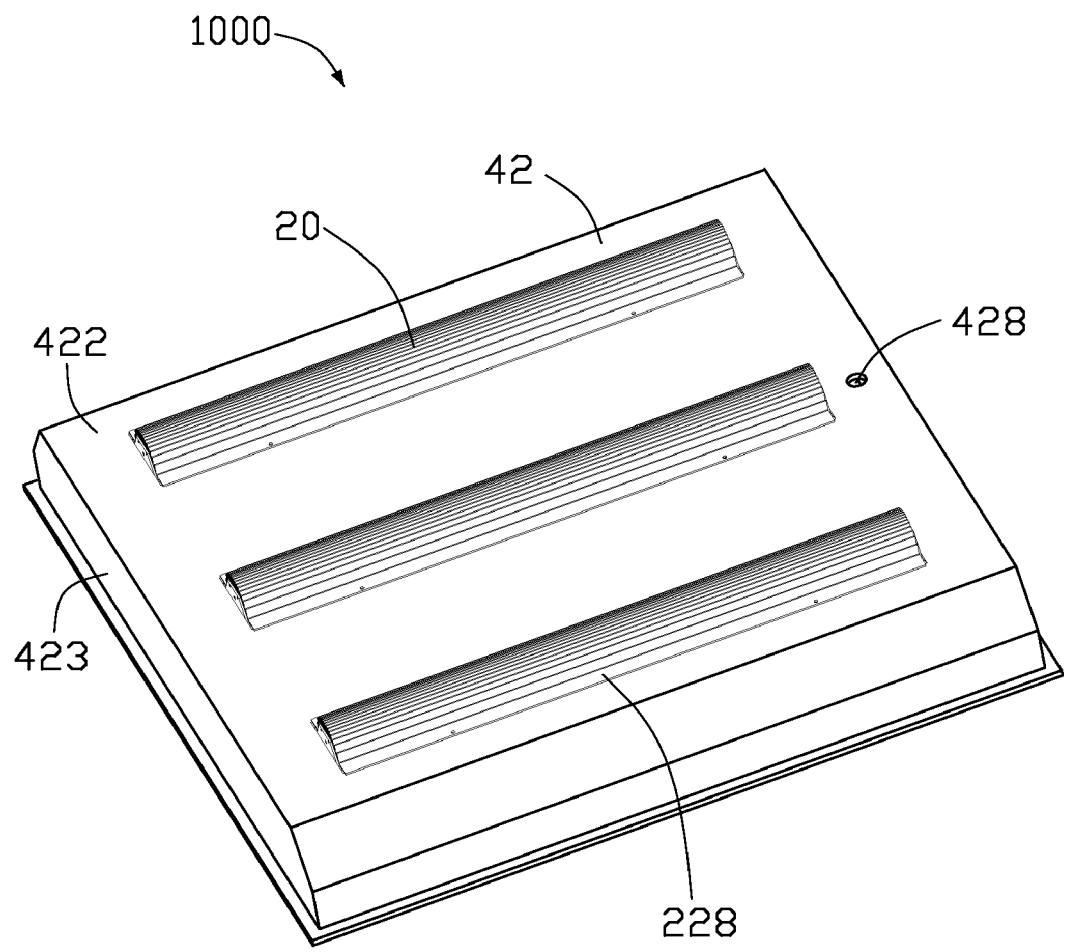
FIG. 1 is an isometric, assembled view of an LED illuminating device according to a first embodiment.
Figure 2:
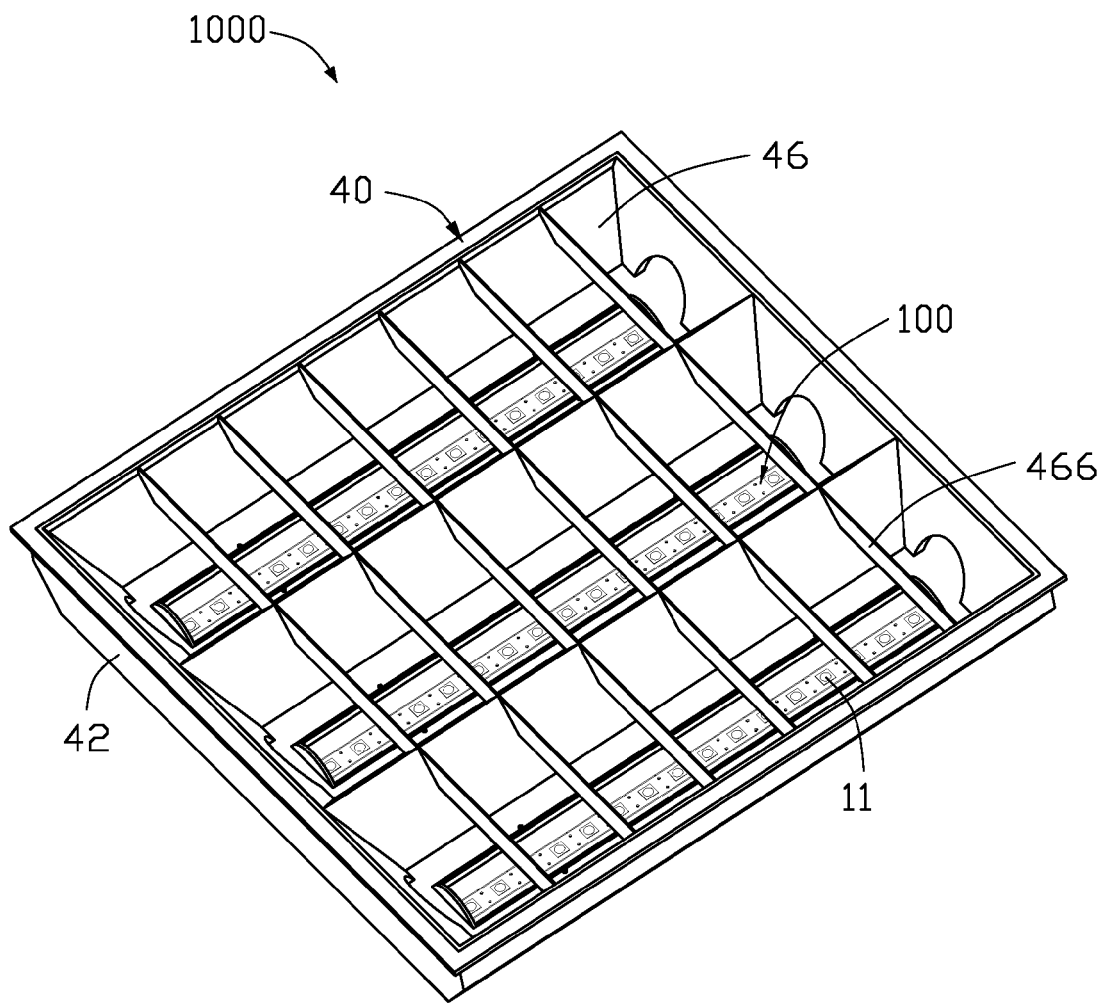
FIG. 2 shows the LED illuminating device of FIG. 1, but viewed from another viewpoint, with light penetrable covers thereof removed.
Figure 3:
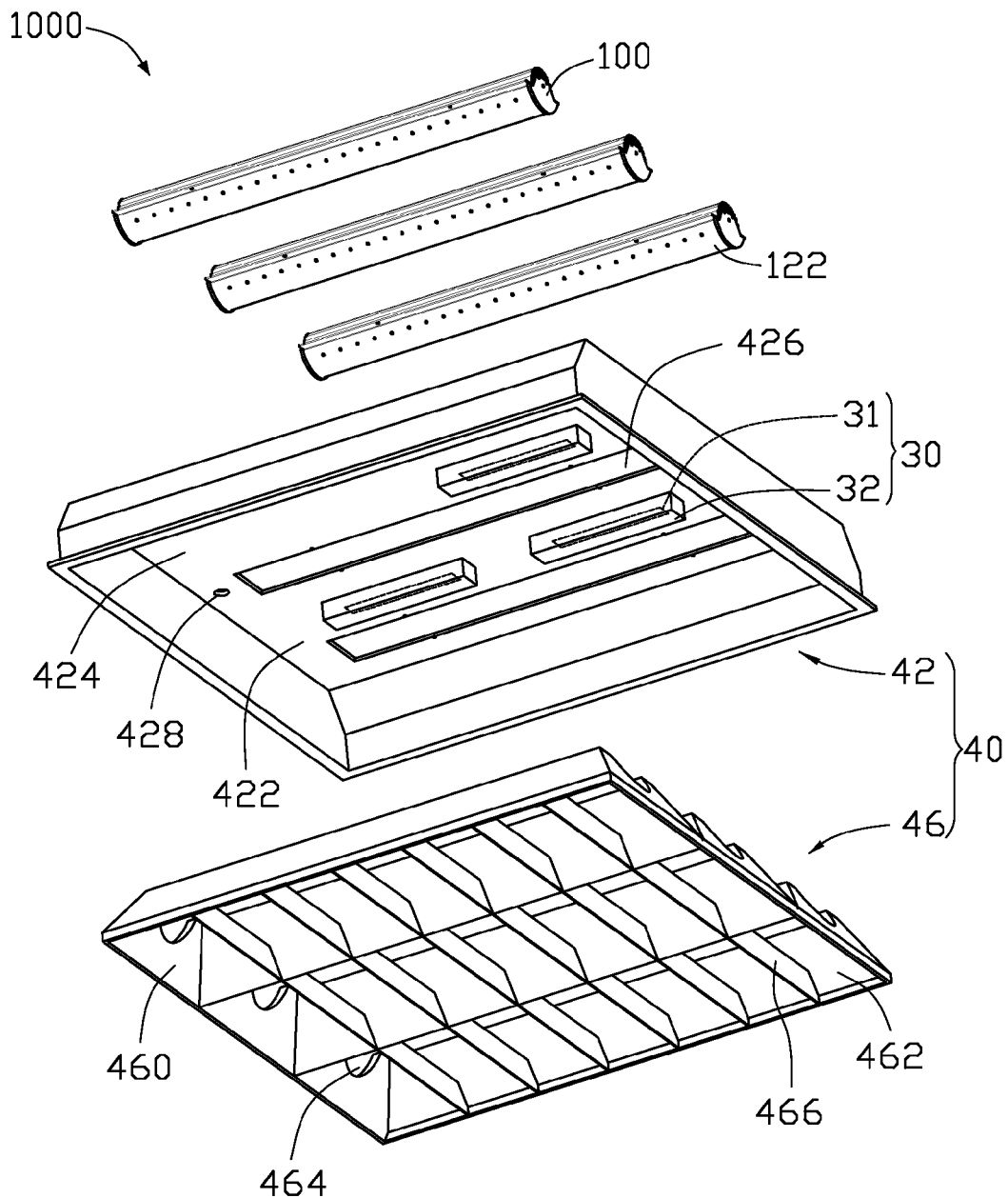
FIG. 3 is an isometric, exploded view of the LED illuminating device of FIG. 1.

Referring to FIGS. 1-3, an LED illuminating device 1000 according to a first embodiment includes a mounting module 40, a plurality of lamp units 100 and an electrical module 30 mounted on the mounting module 40. The lamp units 100 are identical to each other, and are arranged parallel to each other.

Figure 4:
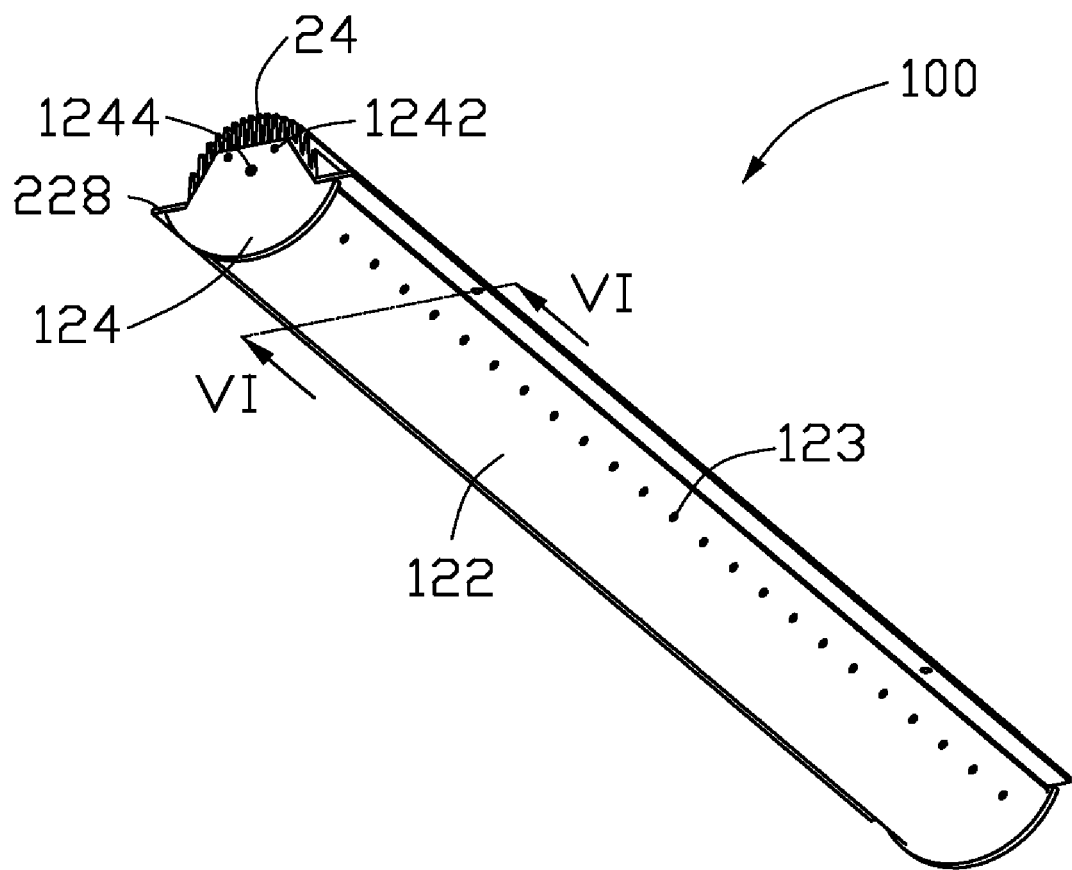
FIG. 4 is an isometric, assembled view of a lamp unit of the LED illuminating device of FIG. 3.
Figure 5:
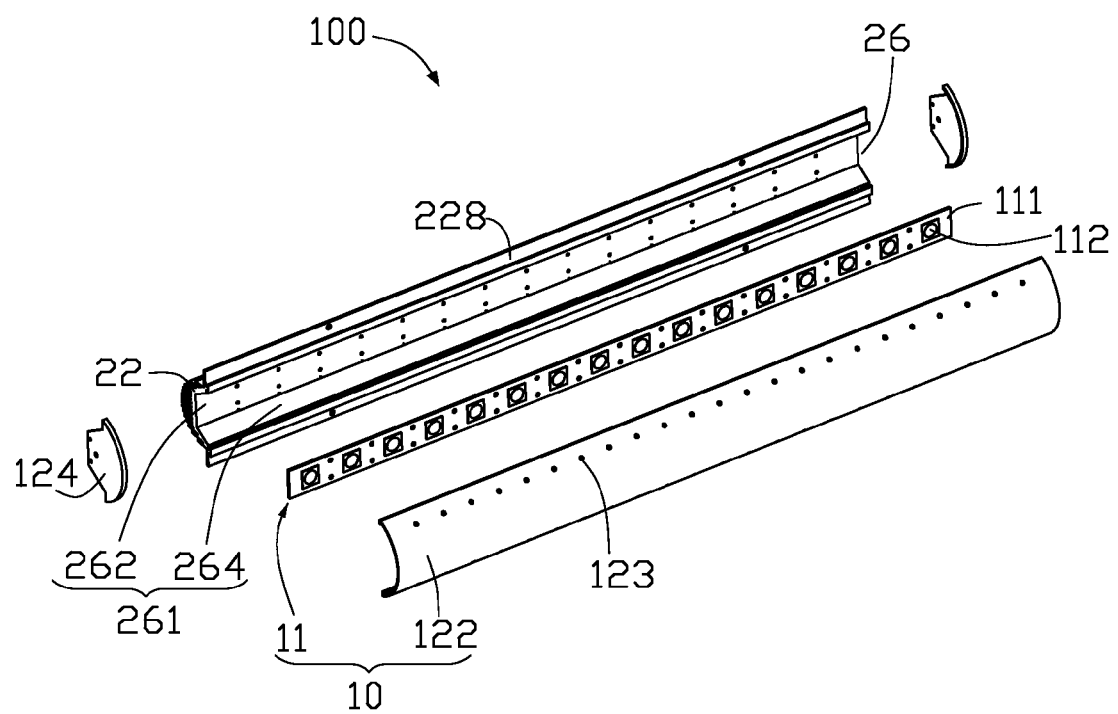
FIG. 5 is an isometric, exploded view of the lamp unit of FIG. 4.
Figure 6:
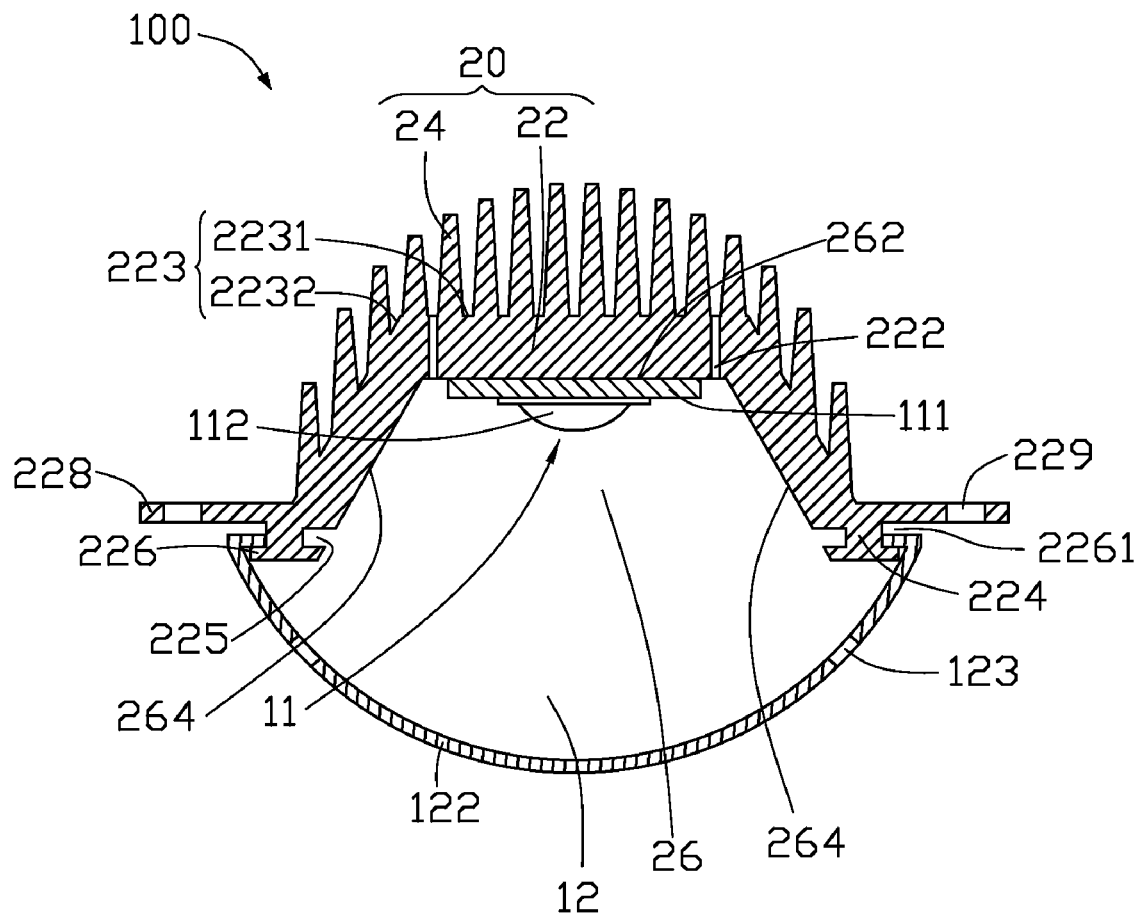
FIG. 6 is a cross-sectional view of the lamp unit of FIG. 4, taken along line VI-VI thereof.

Referring to FIGS. 4-6, the lamp unit 100 includes a light-emitting module 10 and a heat sink 20 arranged above the light-emitting module 10. The light-emitting module 10 is electrically connected with the electrical module 30.

The heat sink 20 includes an elongated metal base 22 and a plurality of metal fins 24 extending from the base 22. A transverse cross section of the base 22 is substantially of an isosceles trapezoid with an isosceles trapezoid-shaped recess 26 in a bottom side thereof along a longitudinal direction of the base 22, to thereby form an outer convex surface 223 at a top side thereof, and an opposite inner U-shaped concave surface 261 at a bottom side thereof. The convex surface 223 includes a horizontal first plane 2231 at a top thereof, and two sloping second planes 2232 located below and at two opposite lateral sides of the first plane 2231. The fins 24 extend vertically and upwardly from the convex surface 223 of the base 22, and are arranged symmetric to a longitudinal center line of the first plane 2231. A height of the fins 23 decreases from the longitudinal center line of the first plane 2231 towards two opposite lateral sides 224 of the base 22. Upper free ends of the fins 23 cooperatively form an imaginary semicircular, convex surface. In other words, the fins 23 at the longitudinal center line of the first plane 2231 of the base 22 have a maximum height. Thus, a heat dissipation at a center of the heat sink 20 is enhanced.

The concave surface 261 includes a horizontal first plane 262 at a top thereof, and two sloping second planes 264 located below and at two opposite lateral sides of the first plane 262. The two second planes 264 extend outwardly and downwardly from the two opposite lateral sides of the first plane 262, respectively. The first plane 262 and the two second planes 264 cooperatively define the elongated recess 26 of the base 22. A horizontal distance between the two second planes 264 increases from the first plane 262 along a downward direction.

The opposite two lateral sides 224 of the base 22 are spaced from each other and cooperatively define a light emitting window therebetween, which is below the concave surface 261. Each of the lateral sides 224 forms a bracket 226 and a mounting flange 228 on a corresponding sloping plane 2232 of the convex surface 223 thereof. The bracket 226 extends horizontally and outwardly from the convex surface 223. The mounting flange 228 is located above the bracket 226, and extends horizontally and outwardly from the convex surface 223. The mounting flange 228 and the bracket 226 cooperatively define a first engaging groove 2261 therebetween. A plurality of mounting apertures 229 are defined in the mounting flange 228 for mounting the lamp unit 100 to the mounting module 40. Further, each of the lateral sides 224 of the base 22 defines a second engaging groove 225 in a corresponding second plane 264 of the concave surface 261.

The light-emitting module 10 includes a light source 11 and a light penetrable cover 122. The light source 11 is received in the elongated recess 26 of the base 22 of the heat sink 20, and attached to the first plane 262 of the concave surface 261 of the base 22. The heat sink 20 and the light source 11 are assembled together to form a light engine for the lamp unit 100. The first plane 262 of the concave surface 261 of the base 22 functions as a heat-absorbing surface for the light source 11, and the convex surface 223 of the base 22 functions as a heat-spreading surface for the light source 11.

The light source 11 includes at least one light bar. The light bar includes an elongated substrate 111 forming electrical circuits thereon, and a plurality of LEDs 112 arranged on the substrate 111 and electrically connected to the electrical circuits. A pair of electrodes are provided at two opposite ends of the substrate 111. The LEDs 112 are evenly spaced from each other along the substrate 111, and are electrically connected to the electrodes. When the light source 11 is mounted to the first plane 262 of the base 22, a layer of thermal interface material (TIM) may be applied between the substrate 111 of the light source 11 and the first plane 262 of the base 22 to eliminate an air interstice therebetween, to thereby enhance a heat conduction efficiency between the light source 11 and the base 22. Alternatively, the substrate 111 of the light source 11 can be attached to the first plane 262 of the base 22 fixedly and intimately through surface mount technology (SMT). Electrical circuits formed on the substrate 111 can be directly formed on the first plane 262 of the base 22, and the LED 112 is directly attached to the electrical circuits of the first plane 262 of the base 22, whereby the substrate 111 can be omitted and a heat resistance between the LEDs 112 and the base 22 is reduced.

The light penetrable cover 122 is located in front of the light source 11 and mounted to the base 22 of the heat sink 20. The light penetrable cover 122 functions as an optical lens for the LEDs 112 of the light source 11. Light emitted by LEDs 112 of light source 11 is guided to environment by the light penetrable cover 122. The light penetrable cover 122 is substantially C-shaped. The light penetrable cover 122 is mounted to the heat sink 20 by inserting two opposite lateral sides of the light penetrable cover 122 into the first engaging grooves 2261 of the base 22. Alternatively, the light penetrable cover 112 can be mounted to the heat sink 20 by inserting two opposite lateral sides of the light penetrable cover 112 in the second engaging grooves 225 of the base 22. The light penetrable cover 122 and the concave surface 261 of the base 22 cooperatively define a chamber 12 with two opposite longitudinal ends thereof being open. Two end covers 124 are mounted to two opposite longitudinal ends of the heat sink 20 and cover the two open longitudinal ends of the chamber 12, respectively. Each end cover 124 defines a plurality of mounting holes 1242 therein for screws extending therethrough to mount the end cover 124 to the heat sink 20. Each end cover 124 further defines a wire hole 1244 therein for electrical wires of the light source 11 extending therethrough.

In operation of the lamp unit 100, a large amount of heat is generated by the LEDs 112 of the light source 11. As the light source 11 is attached to the heat sink 20, the heat generated by the LEDs 112 can be conducted not only to the fins 24 above the light source 11 for dissipating via a first portion of the base 22 which connected with the light source 11, but also to two lateral second portions of the base 22 which connected two opposite lateral sides of the first portion of the base 22 and to the fins 24 formed on the second portions of the base 22 via the first portion of the base 22. The heat of the LEDs 112 is removed timely and effectively by the heat sink 20. Thus, the LEDs 112 can be kept working at a lower temperature, and the brightness, lifespan, and reliability of the lamp unit 100 will be improved. At the same time, as the light source 11 is attached to the first plane 262 of the concave surface 261 of the base 22, the two second planes 264 beside the first plane 262 cooperatively function as a light reflector to amplify the light illumination of the lamp unit 100. Light emitted by the LEDs 112 is reflected and guided by the two second planes 264 to outside objects through the light penetrable cover 122, so that the lamp unit 100 can illuminate a desired large area.

In order to further improve the heat dissipating efficiency of the lamp unit 100, the base 22 of the heat sink 20 defines a plurality of air exchanging holes 222 through the first plane 2231 of the convex surface 223 and the first plane 262 of the concave surface 261. The light penetrable cover 122 defines a plurality of air venting holes 123 therein. The air exchanging holes 222 are located at two lateral sides of the first plane 262 and evenly spaced from each other along the base 22. The air venting holes 123 are located adjacent to two opposite lateral sides of the light penetrable cover 122 and evenly spaced from each other along the light penetrable cover 122. Air in the chamber 12 is heated by the heat of the LEDs 112, and then floats upwardly. The heated, upwardly floating air escapes to ambient atmosphere via the exchanging holes 222 defined in the base 22 of the heat sink 20. Cooling air in the ambient atmosphere enters into the chamber 12 via the air venting holes 123 defined in the light penetrable cover 122, whereby a natural air convection is circulated between the chamber 12 and the ambient atmosphere. The two second planes 264 of the base 22 continuously exchange heat with the air flowing through the chamber 12, which greatly improves the heat dissipating effectiveness of the heat sink 20.

Referring back to the FIGS. 1-3, the mounting module 40 includes a lampshade 42 and a light distributing member 46. The lampshade 42 includes a top mounting plate 422 and a sidewall 423 extending downwardly from a periphery of the mounting plate 422. The mounting plate 422 is substantially rectangular. The sidewall 423 expands slightly outwardly from the periphery of the mounting plate 422. The lampshade 42 defines a receiving space 424 therein for accommodating the light distributing member 46 and the light-emitting module 10 of each lamp unit 100 therein. The receiving space 424 is surrounded by the sidewall 423 and the mounting plate 422. A plurality of elongated openings 426 are defined in the mounting plate 422 for mounting the lamp units 100 on the mounting plate 422. The openings 426 are parallel to and spaced from each other, and communicate with the receiving space 424. A size of the opening 426 of the mounting plate 422 is slightly larger than the light penetrable cover 122 and smaller than the heat sink 20. The mounting plate 422 further defines a wire hole 428 therein for the electrical wires extending therethrough.

The light distributing member 46 is accommodated in the receiving space 424 of the lampshade 42. The light distributing member 46 includes a rectangular frame 460, a plurality of elongated reflecting plates 462 and a plurality of the elongated partition plates 466 mounted in the frame 460. The reflecting plates 462 are connected between two opposite sides of the frame 460 and spaced from each other, thereby defining an elongated cutout 464 between every two adjacent reflecting plates 462 corresponding to the elongated opening 426 of the lampshade 42. The partition plates 466 are connected between the other two opposite sides of the frame 460 and spaced from each other. The partition plates 466 are perpendicular to and interconnected with the reflecting plates 462. When the light distributing member 46 is mounted to the lampshade 42, the frame 460 of the light distributing member 46 is attached to an inner surface of the sidewall 423 of the lampshade 42.

The electrical module 30 is mounted on an inner surface of the mounting plate 422 of the lampshade 42. The electrical module 30 includes at least one protecting cover 32 and at least one circuit board 31 received in the protecting cover 32.

The protecting cover 32 protects the circuit board 31 from an outer environment. The light source 11 of each lamp unit 100 is electrically connected with the circuit board 31 via the electrical wires. The electrical module 30 provides drive power, control circuit and power management for the light source 11 of each lamp unit 100.

When assembled, fixing devices, such as screws, extend through the mounting apertures 229 of the heat sink 20 and threadedly engage into the mounting plate 422, thereby to assemble the lamp units 100 in the corresponding openings 426 of the lampshade 42 to form the LED illuminating device 1000. The light-emitting module 10 of each lamp unit 100 is received at the corresponding opening 426 of the lampshade 42 and a corresponding cutout 464 of the light distributing member 46, with two reflecting plates 462 located at two opposite lateral sides of the light-emitting module 10. The lateral sides 224 of base 22 of the heat sink 20 is located in the corresponding opening 426 with the mounting flanges 228 of the heat sink 20 abutting against the mounting plate 422 beside the corresponding opening 426, and the fins 24 of the heat sink 20 are located above the mounting plate 422 of the lampshade 42.

During operation, the light sources 11 of the lamp units 100 are connected to the circuit board 31 of the electrical module 30 through the electrical wires, whereby the external power source can supply electric current to the LEDs 112 through the circuit board 31 to cause the LEDs 112 to emit light. The light of the LEDs 112 of each lamp unit 100 emitting through the light penetrable cover 122 is reflected by the reflecting plates 462 of the light distributing member 46 to outside for lighting. The illumination capability the LED illuminating device 1000 is enhanced by mounting a plurality of lamp units 100 on the mounting module 40.

Figure 7:
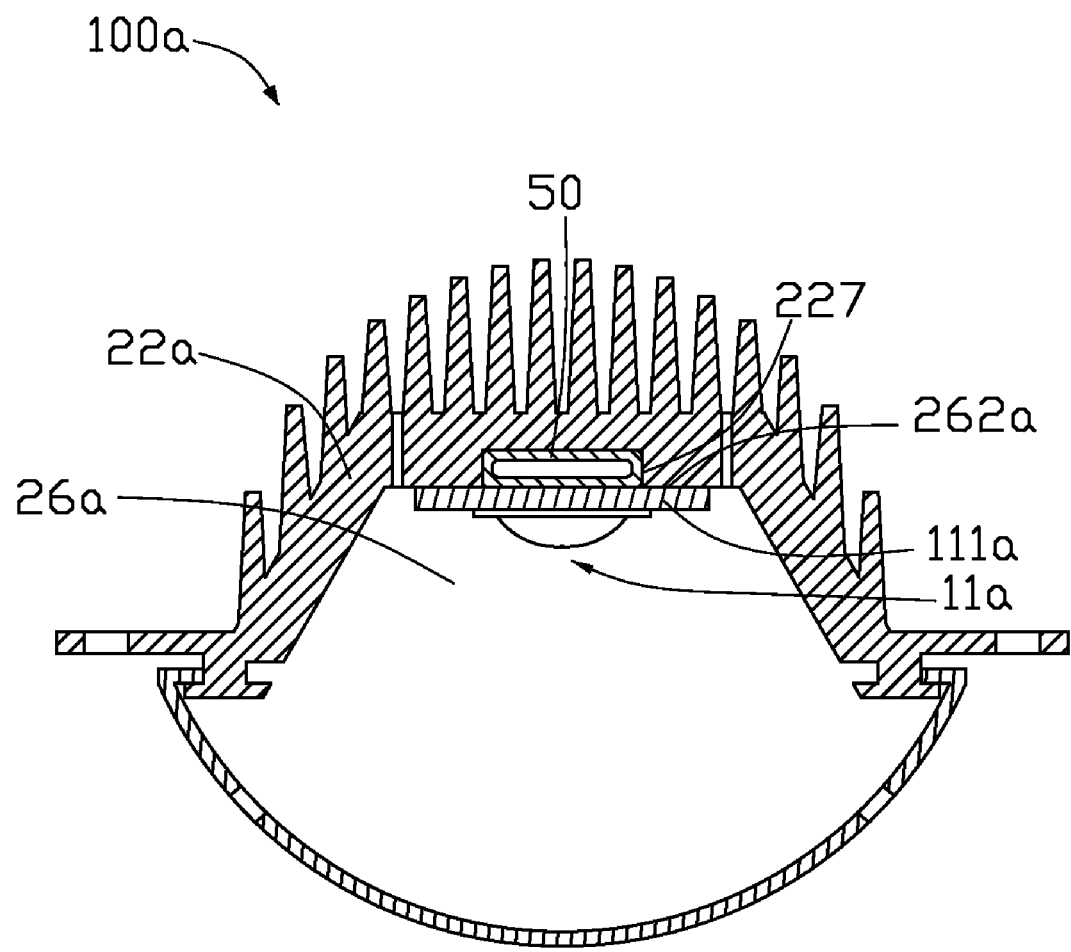
FIG. 7 is a cross-sectional view of a lamp unit of an LED illuminating device according to a second embodiment.

Referring to FIG. 7, a lamp unit 100a of an LED illuminating device according to a second embodiment is illustrated. Except the following differences, the lamp unit 100a of the present embodiment is essentially the same as the lamp unit 100 of the previous embodiment. In the present embodiment, a base 22a of a heat sink of the lamp unit 100a defines longitudinally an elongated groove 227 in a horizontal first plane 262a thereof. Light source 11a is received in an elongated recess 26a defined in the base 22a and attached to the first plane 262a. A flat heat pipe 50 is received in the groove 227 and sandwiched between the base 22a and the light source 11a to transfer heat of the light source 11a to the base 22a. The heat pipe 50 is well known for heat dissipation due to its excellent heat transfer performance. The heat pipe 50 has a low thermal resistance in heat transfer due to a phase change mechanism of working fluid employed in the heat pipe 50, which improves the heat conduction efficiency between the light source 11a and the base 22a. The light source 11a has a substrate 111a attached to the heat pipe 50.

Figure 8:
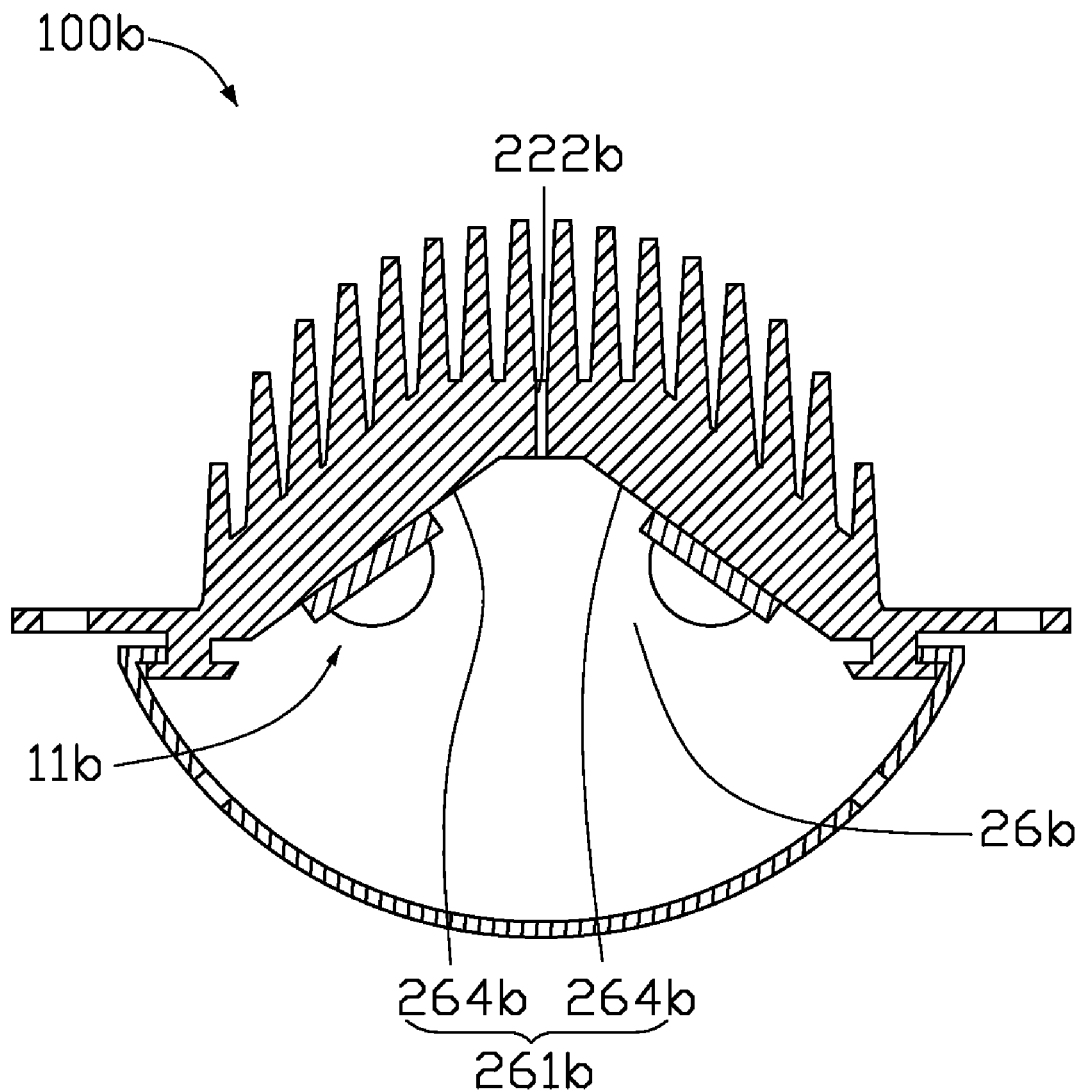
FIG. 8 is a cross-sectional view of a lamp unit of an LED illuminating device according to a third embodiment.

Referring to FIG. 8, a lamp unit 100b of an LED illuminating device according to a third embodiment is illustrated. Except the following differences, the lamp unit 100b of the present embodiment is essentially the same as the lamp unit 100 of the previous embodiment. In the present embodiment, a base 22b of a heat sink of the lamp unit 100b forms a substantially V-shaped concave surface 261b at a bottom side thereof. The concave surface 261b includes two sloping planes 264b intersecting with each other. The light source 11b includes a pair of light bars received in an elongated recess 26b defined in the base 22b and symmetrically attached to the two sloping planes 264b. Each of the two sloping planes 264b of the concave surface 261b of the base 22b functions as a heat-absorbing surface for the light source 11b. The base 22b defines a plurality of exchanging holes 222b through the base 22b at a joint of the two sloping planes 264b of the concave surface 261b.

Figure 9:
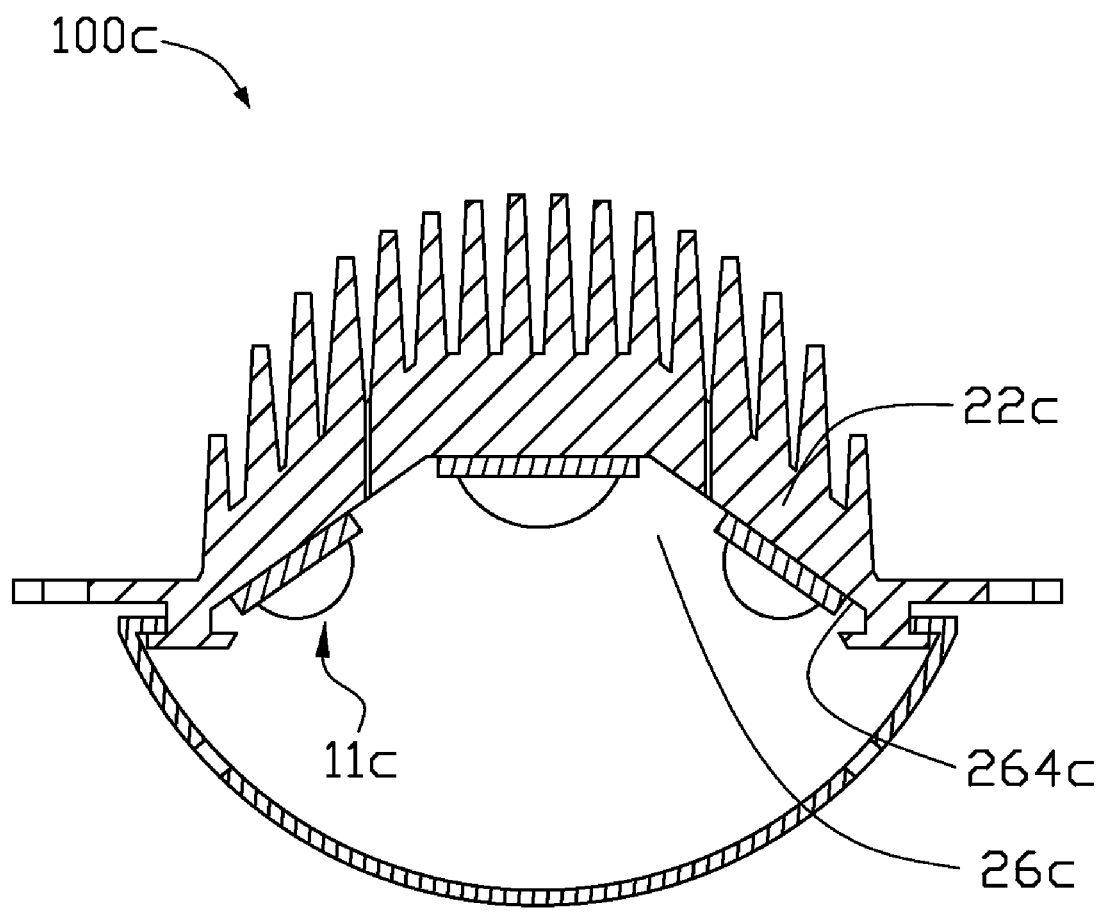
FIG. 9 is a cross-sectional view of a lamp unit of an LED illuminating device according to a fourth embodiment.

Referring to FIG. 9, a lamp unit 100c of an LED illuminating device according to a fourth embodiment is illustrated. Except the following differences, the lamp unit 100c of the present embodiment is essentially the same as the lamp unit 100 of the previous embodiment. In the present embodiment, the lamp unit 100c further includes two auxiliary light sources 11c received in an elongated recess defined in a base 22c of a heat sink thereof and attached to two sloping second planes 264c of the base 22c to expand the illumination area and increase the illumination intensity of the lamp unit 100c. Each of the two sloping second planes 264c of the base 22c functions as a heat-absorbing surface for the auxiliary light source 11c.

Figure 10:
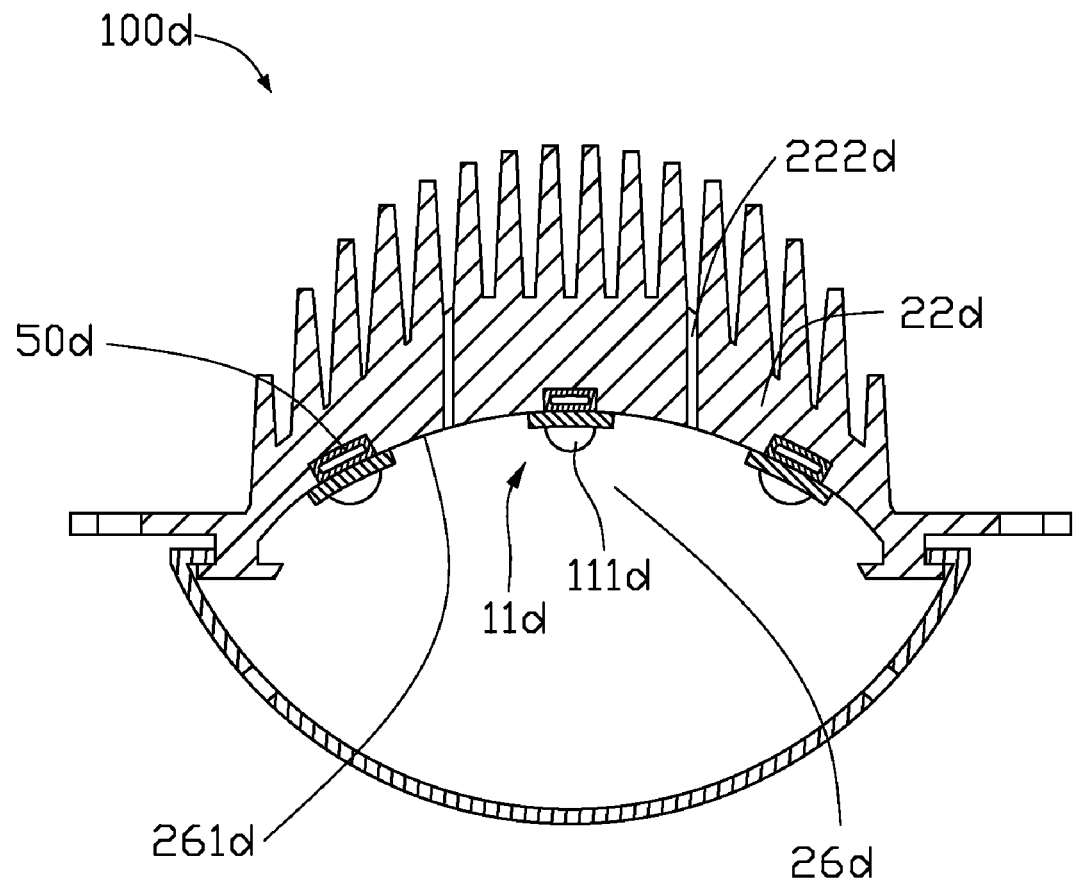
FIG. 10 is a cross-sectional view of a lamp unit of an LED illuminating device according to a fifth embodiment.

Referring to FIG. 10, a lamp unit 100d of an LED illuminating device according to a fifth embodiment is illustrated. Except the following differences, the lamp unit 100d of the present embodiment is essentially the same as the lamp unit 100 of the previous embodiment. In the present embodiment, a base 22d of a heat sink of the lamp unit 100d forms an arch-shaped concave surface 261d at a bottom side thereof. Light source 11d includes a plurality of light bars received in an elongated recess 26d defined in the base 22d and attached to the concave surface 261d. A substrate 111d of each light bar is arch-shaped corresponding to the concave surface 261d. The light bars of light source 11d are evenly spaced from each other along a transverse direction of the base 22d. The base 22d defines a plurality of exchanging holes 222d through the base 22b. The exchanging holes 222d are evenly spaced from each other along the transverse direction of the base 22d. Each exchanging hole 222d is located between two adjacent light bars of the light source 11d. The concave surface 261d of the base 22d functions as a heat-absorbing surface for the light source 11d. The lamp unit 100d further provides a plurality of heat pipes 50d arranged between the base 22d and the light source 11d. The substrates 111d are attached to the heat pipes 50d.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A lamp unit, comprising:
a light-emitting module comprising a light source having a plurality of LEDs and a light penetrable cover defining a plurality of air venting holes therein; and
a heat sink arranged above the light-emitting module, the heat sink comparing a elongated base and a plurality of fins formed on the base, the base having an outer convex surface formed at a top side thereof and an opposite inner concave surface formed at a bottom side thereof, the fins extending upwardly from the convex surface of the base, the concave surface defining an elongated recess extending along a longitudinal direction of the base, a light emitting window being defined between two opposite lateral sides of the base and located below the concave surface, the light source being received in the elongated recess of the base and thermally attached to the concave surface, the base of the heat sink defining a plurality of air exchanging holes through the convex surface and the concave surface, the light penetrable cover being located below of the light source, the light penetrable cover attached to the base, the light penetrable cover and the concave surface of the base cooperatively defining a chamber, air flowing into and out of the chamber via the venting holes of the light penetrable cover and exchanging holes of the base, heat generated by the LEDs of the light source being dissipated via the heat sink and via air flowing through the chamber, light emitted by the LEDs of the light source being guided to outside via the light penetrable cover.

2. The lamp unit of claim 1, wherein the concave surface of the base comprises a horizontal first plane at a top thereof and two sloping second planes located below and at two opposite lateral sides of the first plane, the two second planes extending outwardly and downwardly from the two opposite lateral sides of the first plane, respectively, the LEDs of the light source being attached to the first plane and thermally connecting therewith.

3. The lamp unit of claim 2, wherein the air exchanging holes of the base are located at two lateral sides of the first plane and evenly spaced from each other along the base.

4. The lamp unit of claim 2, wherein the light-emitting module further comprises two auxiliary light sources received in the elongated recess of the base and attached to the two second planes and thermally connecting therewith.

5. The lamp unit of claim 1, wherein the concave surface is substantially V-shaped and comprises two sloping planes intersecting with each other, the LEDs of the light source being attached to the two sloping planes and thermally connecting therewith, the exchanging holes being located at a joint of the two sloping planes of the concave surface.

6. The lamp unit of claim 1, wherein the concave surface is arch-shaped, the LEDs of the source being evenly spaced from each other along a transverse direction of the base, the exchanging holes being evenly spaced from each other along the transverse direction of the base, each exchanging hole being located between two adjacent LEDs of the light source.

7. The lamp unit of claim 1, wherein the light source comprises at least one light bar, the light bar having an elongated substrate and the plurality of LEDs being arranged on the substrate.

8. The lamp unit of claim 1, further comprising at least one heat pipe arranged between the base and the light source, and thermally connecting with the light source.

9. The lamp unit of claim 1, wherein the air venting holes of the light penetrable cover are located adjacent to two opposite lateral sides of the light penetrable cover and evenly spaced from each other along the light penetrable cover.

10. The lamp unit of claim 1, wherein the fins extend vertically and upwardly from the concave surface of the base and are arranged symmetric to a longitudinal center line of the concave surface, a height of the fins decreasing from the longitudinal center line of the concave surface towards the two opposite lateral sides of the base.

11. An LED illumination device, comprising:
a mounting module comprising a lampshade defining a receiving space therein, the lampshade comprising a mounting plate and a sidewall expanding downwardly from a periphery of the mounting plate, the receiving space being cooperatively defined by the mounting plate and the sidewall; and
at least one lamp unit mounted on the lampshade, the at least one lamp unit comprising:
a light-emitting module comprising a light source having a plurality of LEDs and a light penetrable cover defining a plurality of air venting holes therein; and
a heat sink arranged above the light-emitting module, the heat sink comparing a elongated base and a plurality of fins formed on the base, the base having an outer convex surface formed at a top side thereof and an opposite inner concave surface formed at a bottom side thereof, the fins extending upwardly from the convex surface of the base, the concave surface defining an elongated recess extending along a longitudinal direction of the base, a light emitting window being defined between two opposite lateral sides of the base and below the concave surface, the light source being received in the elongated recess of the base and thermally attached to the concave surface, the base of the heat sink defining a plurality of air exchanging holes through the convex surface and the concave surface, the light penetrable cover being located below of the light source, the light penetrable cover being attached to the heat sink, the light penetrable cover and the concave surface of the base cooperatively defining a chamber, air flowing into and out of the chamber via the venting holes of the light penetrable cover and exchanging holes of the base, heat generated by the LEDs of the light source being dissipated via the heat sink and via air flowing through the chamber, light emitted by the LEDs of the light source being guided to outside via the light penetrable cover.

12. The LED illumination device of claim 11, wherein the mounting plate of the lampshade defines at least one elongated opening therein, the at least one lamp unit being located in the at least one elongated opening of the lampshade, a pair of mounting flanges extending respectively from the two opposite lateral sides of the base and abutting on the mounting plate to mount the lamp unit of the lampshade in the elongated opening, the light-emitting module of the at least one lamp unit being received at the at least one elongated opening of the lampshade, the fins of the heat sink of the at least one lamp unit being located above the mounting plate of the lampshade.

13. The LED illumination device of claim 12, wherein the mounting module further comprises a light distributing member accommodated in the receiving space of the lampshade, the light distributing member comprising a frame mounted to the sidewall of the lampshade, a plurality of elongated reflecting plates and a plurality of the elongated partition plates mounted in the frame, the reflecting plates being connected between two opposite sides of the frame and spaced from each other, an elongated cutout being defined between every two adjacent reflecting plates corresponding to the at least one elongated opening of the lampshade, the partition plates being perpendicular to and interconnected with the reflecting plates.

14. The LED illumination device of claim 11, wherein the at least one lamp unit further comprises two end covers mounted to two opposite longitudinal ends of the heat sink, each of the end covers defining a wire hole therein for electrical wires of the light source extending therethrough.

15. The LED illumination device of claim 11, wherein the light penetrable cover is substantially C-shaped, the base of the heat sink defining two engaging grooves in the two opposite lateral sides thereof, two lateral sides of the light penetrable cover being inserted in the two engaging grooves of the base, respectively.

16. The LED illumination device of claim 11, wherein the concave surface of the base comprises a horizontal first plane at a top thereof and two sloping second planes located below and at two opposite lateral sides of the first plane, the two second planes extending outwardly and downwardly from the two opposite lateral sides of the first plane, respectively, the LEDs of the light source being arranged on the first plane.

17. The LED illumination device of claim 16, wherein the light-emitting module further comprises two auxiliary light sources received in the elongated recess of the base and thermally attached to the two second planes.

18. The LED illumination device of claim 11, wherein the concave surface is substantially V-shaped and comprises two sloping planes intersecting with each other, the LEDs of the light source being arranged on the two sloping planes.

19. The LED illumination device of claim 11, wherein the concave surface is arch-shaped, the LEDs of the source being evenly spaced from each other along a transverse direction of the base.

20. The LED illumination device of claim 11, further comprising an electrical module mounted on the lampshade and electrically connected with the light source of the light-emitting module of the at least one lamp unit.

* * * * *